United States Patent [19]

Doornenbal

[11] Patent Number: 4,749,962
[45] Date of Patent: Jun. 7, 1988

[54] CLOCK-SIGNAL REGENERATOR COMPRISING A CRYSTAL OSCILLATOR INCORPORATED IN A PHASE-LOCKED LOOP

[75] Inventor: Anthony Doornenbal, Hilversum, Netherlands

[73] Assignee: U.S. Philips Corp., New York, N.Y.

[21] Appl. No.: 58,096

[22] Filed: Jun. 4, 1987

[30] Foreign Application Priority Data

Jun. 6, 1986 [NL] Netherlands ............... 8601463

[51] Int. Cl.⁴ ............... H03L 7/08; H03B 5/30
[52] U.S. Cl. ............... 331/17; 331/8; 331/25; 331/116 R; 332/19
[58] Field of Search ............... 331/8, 17, 25, 116 R, 331/116 FE, 158, 159, 160, 177 R; 332/19; 375/120

[56] References Cited

U.S. PATENT DOCUMENTS 3,569,865 3/1971 Heaky ............... 331/116 R
3,603,893 9/1971 Hughes ............... 331/8 X Primary Examiner—Eugene R. LaRoche
Assistant Examiner—David Mis
Attorney, Agent, or Firm—Thomas A. Briody; Jack Oisher

[57] ABSTRACT

The frequency of a voltage controlled crystal oscillator is conventional pulled by means of a varicap diode forming the load capacitance of the oscillator crystal. In order to realize a wider range of frequency pulling, the load capacitance 44 is alternately switched on and off in a known manner. According to the invention a band-switch diode 46 is utilized as a switch element, the hole-storage time of this diode being as long as or longer than the oscillator cycle. By applying a low-frequency control voltage to the diode it is rendered self-switching within the oscillator cycle, so that proportional frequency tuning is achieved.

2 Claims, 2 Drawing Sheets

CLOCK-SIGNAL REGENERATOR COMPRISING A CRYSTAL OSCILLATOR INCORPORATED IN A PHASE-LOCKED LOOP

BACKGROUND OF THE INVENTION

1. Field of the Invention

The invention relates to a clock-signal regenerator, comprising a crystal oscillator which can be frequency controlled and is incorporated in a phase-locked loop, in which regenerator the oscillator frequency is pulled by means of at least one load capacitance, coupled to the oscillator crystal, which crystal oscillator comprises a switching arrangement connected to a load capacitance for effectively connecting the load capacitance to the crystal in dependence on a control signal to be applied to the switching arrangement, which control signal represents the phase deviation between the clock signal to be regenerated and the regenerated clock signal.

The invention likewise relates to a voltage-controlled crystal oscillator suitable for use in a similar clock signal regenerator, and a telecommunication terminal comprising a similar clock signal regenerator.

2. Description of the Related Art

A frequency-controlled crystal oscillator of the type mentioned above is known from the U.S. Pat. No. 3,603,893.

It is advantageous to be able to pull the frequency of the crystal oscillator over a wide range. When applied in a clock regenerator the local oscillator is able to follow the clock signal to be regenerated over a wide frequency-range, which increases the practicability. Alternatively, it is possible in a given variation range of the clock signal to be regenerated, to apply a crystal having a larger frequency manufacturing-tolerance. The resulting possibly larger deviation between the incoming clock signal and the nominal oscillator frequency can then be adjusted by the greater frequency pulling.

The crystal oscillator known from the aforesaid United States Patent comprises a load capacitance (U.S. patent reference numeral 37) connected to the oscillator crystal and a switching arrangement formed by a field effect transistor (U.S. patent reference numeral 36) for short circuiting or effectively connecting this load capacitance to the crystal. By selecting a desired, large value of this capacitance, a desired large frequency pulling range can be achieved.

The advantage of a large frequency-pullng range is for example shown by the fact that when manufacturing the crystal oscillator tuning procedure for the nominal frequency can be dispensed with.

The switching arrangement in the above U.S. Patent is designed in the form of a semi-conductor switch element. Such switch elements can be controlled by fast change-over signals whose rise time is of the same order as or shorter than the oscillator frequency; alternatively it is possible to have the change-over controlled by slow change-over signals whose rise time exceeds (by far) the oscillator frequency.

In the event of fast change-over signals, pulses in the oscillator signal may occur owing to the fast change-over. If the polarity of these pulses is opposite to the instantaneous polarity of the oscillator signal, this may lead to a disturbance of the clock frequency derived from the oscillator. This is obviously an undesired effect. This problem could be solved by a synchronising arrangement, synchronising the change-over signals and the oscillator signal; however, such a synchronising arrangement constitutes an additional cost factor. In the event of slow change-over signals, however, the switch element forms a resistive load for the oscillator crystal during the change-over, as a result of which the oscillator may break down.

SUMMARY OF THE INVENTION

It is an object of the invention to provide a clock signal regenerator in which the aforenoted problems cannot occur.

Thereto the clock signal regenerator according to the invention is characterized in that the switching arrangement comprises a semiconductor switch element whose hole-storage time is substantially as long as or longer than the cycle time of the crystal oscillator.

The thus characterized switch element can now be controlled by a slow change-over signal. If the switch element (for example a diode) passes to the conducting state during this change-over this conduction will also be stopped within the cycle of the oscillator frequency, as the algebraic sum of the control signal and the oscillator signal appears across the diode. During this short conducting time no dissipation of oscillator energy will occur as a diode does not dissipate energy during the hole-storage time.

A discrete oscillator-frequency control is obtained by connecting a first capacitance for a number of cycles and a second capacitance for a subsequent number of cycles. The effective oscillator frequency will then be the weighted average over the two numbers of periods. Needless to observe that the largest range of frequency pulling is obtained if there is only one load capacitance which is completely switched on or off.

As will be further explained below the use of such a semi-conductor element has the additional advantage that a proportional frequency control can be achieved too by always switching on and off within a single oscillator period.

An advantageous embodiment of the invention of the clock signal regenerator is further characterized in that the semiconductor switch element is formed by a bandswitch diode. Such diodes show a very low spurious capacitance. If the switching diode is connected in parallel with the load capacitance of the oscillator crystal the total load capacitance will be formed by the sum of the really installed capacitance and the spurious capacitance. It these two are of the same order the oscillator crystal will be loaded by a poorly defined load capacitance as a spurious capacitance is poorly defined and sensitive to all sorts of disturbing influences.

BRIEF DESCRIPTION OF THE DRAWINGS

The invention and its advantages are described with reference to the following figures in which the same elements are indicated by the same reference numerals and in which.

Figure 1:
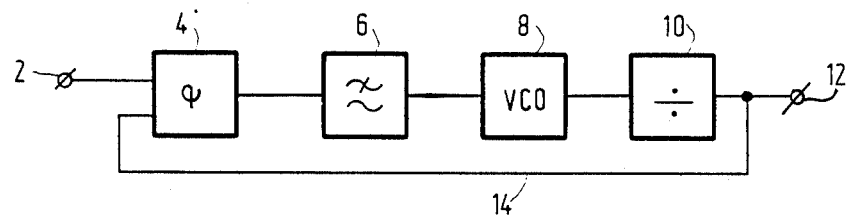
FIG. 1 shows a circuit known per se for a phase-locked loop with a voltage controlled oscillator.

The phase-locked loop known per se according to FIG. 1 comprises a cascade circuit of a phase comparator 4, a low-pass filter 6, a voltage controlled oscillator 8 and a frequency dividing circuit 10, respectively. An external clock signal can be applied to an input 2 of phase comparator 4. Between output 12 and the other input of the phase comparator 4 a feedback connection 14 has been introduced. Low-pass filter 6 is especially required when oscillator 8 is to be excited by a low-frequency control signal. Dividing-circuit 10 is only required if the oscillator frequency differs from (for example is a multiple of) the external clock signal.

Figure 2:
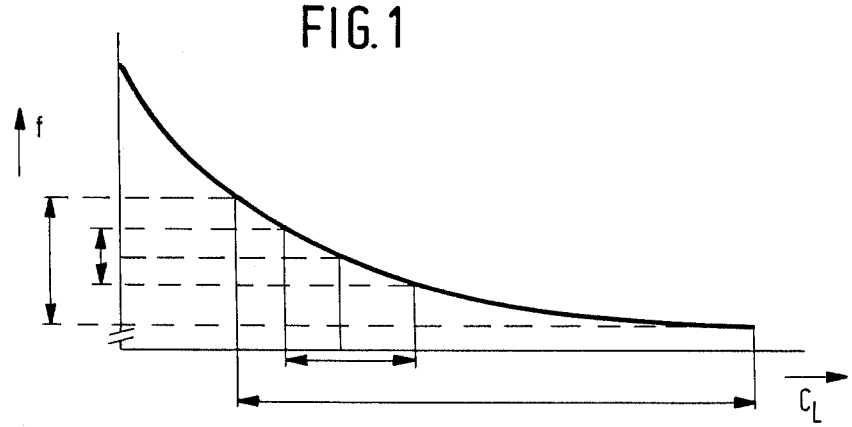
FIG. 2 shows a graph indicating the relation between the frequency pulling of oscillator crystal and the series load capacitance.

Oscillator 8 can be designed as a crystal oscillator. If the crystal of this oscillator is loaded by a series capacitance CL, the change of the crystal frequency will depend on the load capacitance according to the graph in FIG. 2. From this graph it is evident that an extended frequency pulling range requires a considerably extended capacitance range.

The oscillator frequency can be discretely pulled by inserting a switch in parallel with the series capacitance. If the switch is in the conductive state this situation corresponds to infinite load capacitance and thus low crystal-frequency; if the swtich is in a non-conductive state the load capacitance is effectively switched on, the crystal having a relevant higher crystal frequency. Now it is possible by means of these two frequencies to generate a crystal frequency situated therebetween. This is achieved by swtiching on the load capacitance during a first number of oscillator cycles and switching it off during a subsequent second number of cycles. The effective crystal frequency is than the weighted average of the frequencies over the numbers of cycles.

Figure 3:
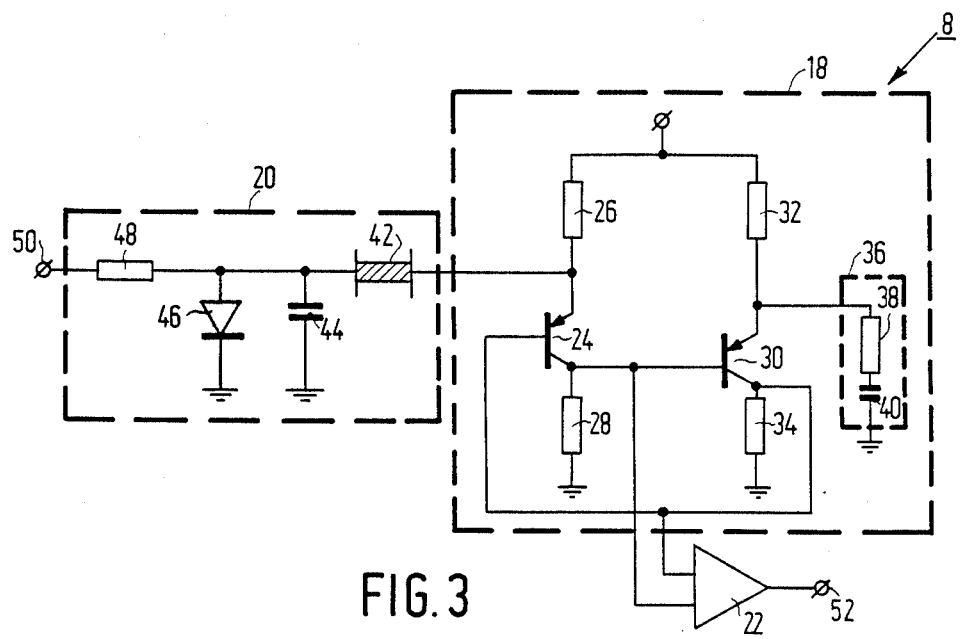
FIG. 3 shows a first circuit of a crystal oscillator in accordance with the invention.

FIG. 3 shows an embodiment of a crystal oscillator in accordance with the invention. Crystal oscillator 8 comprises an oscillator circuit 18 to which are connected a frequency-determining circuit 20 and an output amplifier 22.

Oscillator circuit 18 comprises two cascaded amplifier stages. The first stage comprises a transistor 24 having an emitter resistor 26 of for example 40 kOhms and a collector resistor 28 of for example 2 kOhms. Frequency determining circuit 20 is connected to the emitter of the transistor 24. The second stage comprises a transistor 30 having an emitter resistor 32 (for example 40 kOhms) and a collector resistor 34 (for example 2 kOhms). The collector of transistor 24 is connected to the base of transistor 30, the collector of transistor 30 is connected to the base of transistor 24. A compensating network 36 is connected to the emitter of the transistor 30 to compensate the loop gain for loss owing to spurious capacitances in the circuit.

Compensating network 36 comprises a series arrangement of a resistor 38 (400 Ohms) and a capacitance 40 (80 pF). Thus the impedance of this network at the oscillator frequency of 1.824 MHz amounts to approximately 1400 Ohms. This impedance combined with resistor 32 forms the total emitter impedance of transistor 30. The amplification of the two amplifier stages is determined by the ratio of their collector resistance to their emitter resistance. As oscillation requires the loop-gain value to be 1, this results in a maximum for the value of the impedance of frequency-determining circuit 20.

Frequency-determining circuit 20 comprises a crystal 42 (1.824 MHz) in series with a load capacitance 44 (5 pF). Parallel to capacitance 44 a switching diode 46 has been connected whose anode is excited through resistor 48 (200 kOhms) and control input 50. Diode 46 is of a band switch type having a hole-storage time exceeding 0.5 $\mu$s and a (stray) capacitance being small compared to the value of capacitor 44, for example less than 2 pF. As is known a diode does not show a resistive character within the hole-storage time, so no energy dissipation takes place during that time interval. This makes it possible for the oscillator frequency-pulling to occur at a signal having a rise time exceeding the oscillator cycle by far, for example the signal having a rise time of 30 $\mu$s.

The output signal of oscillator circuit 18 is formed by the difference signal between the collectors of transistor 24 and 30. Output amplifier 22 is designed as a difference amplifier feeding the amplified signal to oscillator output 52.

Figure 4:
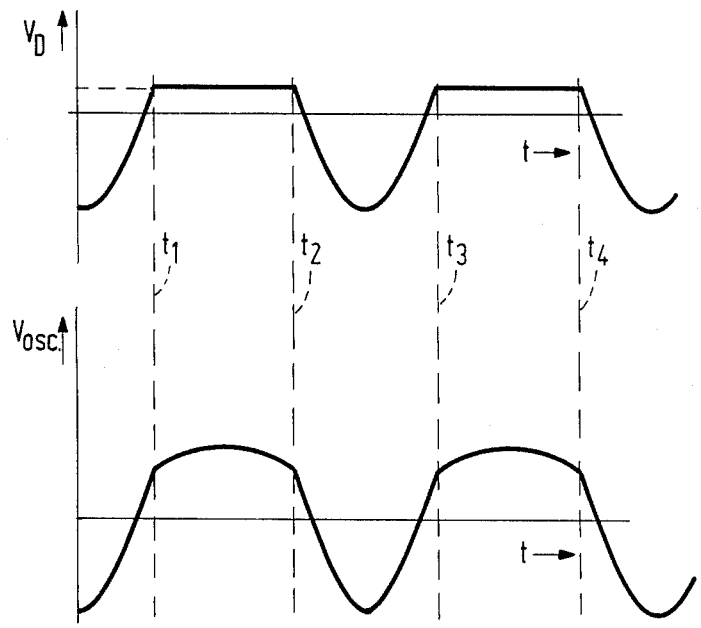
FIG. 4 shows a graph representing the course of the oscillator signal.

The frequency pulling of oscillator 8 in accordance with FIG. 3 is explained with reference to FIG. 4. The upper part of FIG. 4 shows the voltage curve across diode 46 as a function of time. As long as the voltage across the diode is lower than the forward voltage there is across the diode the sum of two voltages namely the low-frequency voltage (direct current), which is fed to terminal 50 and the high frequency oscillator voltage (alternativng current) which is supplied through crystal 42. When the sum of both these voltages becomes higher than the diode forward voltage, diode 46 is rendered conductive and the voltage across this diode does no longer exceed the forward voltage.

Whilst diode 46 is rendered non-conductive crystal 42 is serially loaded by capacitor 44. The oscillator will now show the corresponding higher frequency (for example between instants $t_2$ and $t_3$). During conductance of diode 46 the load capacitance seems to be very large (infinite); the oscillator will now show the corresponding lower frequency (for example between instants $t_1$ and $t_2$).

By varying the DC-voltage on terminal 50 the sine curve in the upper graph will rise and fall. Consequently, the points of intersection with the threshold voltage will move to the left and to the right, causing the share of the low-frequency in the lower part of the graph to increase or decrease. Thus also the resulting oscillator cycle will increase or decrease.

Figure 5:
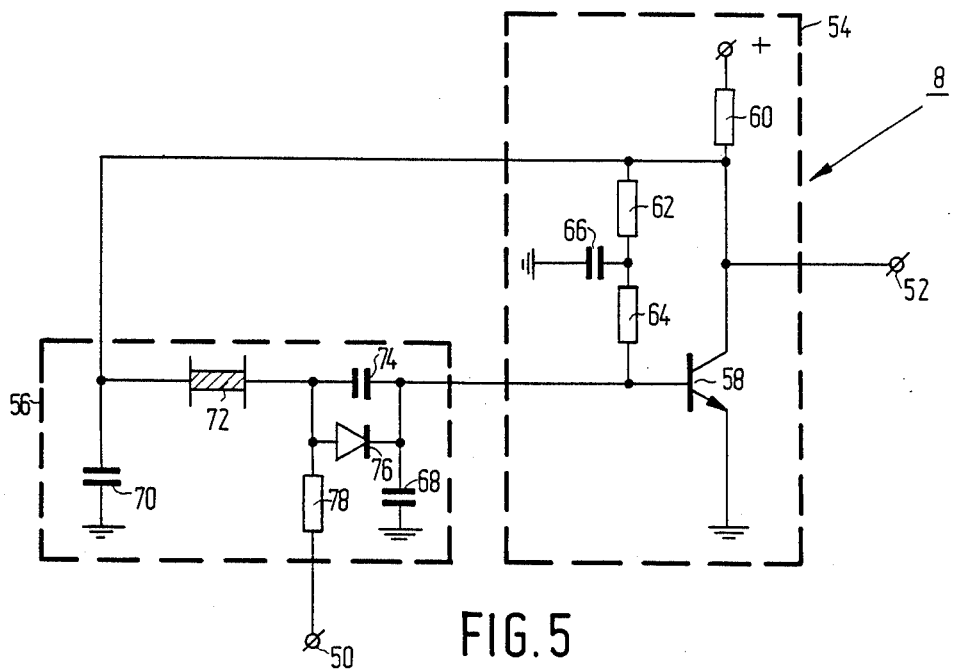
FIG. 5 shows a second circuit of a crystal oscillator in accordance with the invention.

FIG. 5 shows another crystal oscillator in accordance with the invention. This crystal oscillator 8 comprises an amplifier 54 and a frequency determining circuit 56.

Amplifier 54 is formed by a transistor 58 and a collector resistor 60 (460 Ohms). The direct current setting of transistor 58 is realised by means of resistors 62 and 64, serially connected between the collector and the base of transistor 58 (6.2 kOhms each). A capacitance 66 of 1 nF is inserted between the junction point of these resistors and the earth of the system. With this capacitance the high-frequency signal is rather entirely decoupled in order not to decrease too much the amplification of amplifier 54 for high frequencies.

Frequency-determining circuit 56 is formed by a series arrangement of successively a capacitor 68 (220 pF), a capacitor 74 (6.8 pF), crystal 72 (1.824 MHz) and a capacitor 70 (220 pF). The collector of transistor 58 is connected to the junction point of crystal 72 and capacitor 70, the base being connected to the junction point of capacitor 74 and capacitor 68. Connected in parallel with capacitor 74 a switching diode 76 has been incorporated which is controlled through control resistor 78 (200 kOhms) and control input 50.

The load capacitance of crystal 72 is formed by the series arrangement of the capacitances 68, 70 and 74, which series circuit is connected in parallel with crystal 72. If diode 76 is rendered non-conductive, the load capacitance is chiefly determined by the capacitor having the lowest value, this is capacitor 74. If diode 76 is conductive the load capacitance is formed by the series circuit of capacitors 68 and 70, which series circuit has a considerably higher capacitance value than capacitor 74. In this manner the load capacitance can be varied between approximately 6.8 pF and approximately 110 pF, with corresponding frequency pulling.

What is claimed is:

1. A clock-signal regenerator, comprising a crystal oscillator which can be frequency controlled and is incorporated in a phase-locked loop, in which regenerator the oscillator frequency is pulled by means of at least one load capacitance coupled to the oscillator crystal, which crystal oscillator comprises a switching arrangement connected to a load capacitance for effectively connecting the load capacitance to the crystal, in dependence on a control signal applied to the switching arrangement which control signal represents the phase deviation between a clock signal to be regenerated and the regenerated clock signal, characterized in that the switching arrangement comprises a semiconductor switch element whose hole-storage time is substantially as long as or longer than the cycle time of the crystal oscillator.

2. A clock signal regenerator as claimed in claim 1, characterized in that the semiconductor switch element is a band-switch diode.

* * * * *